US008847619B2

(12) United States Patent
Hargan et al.

(10) Patent No.: US 8,847,619 B2
(45) Date of Patent: Sep. 30, 2014

(54) APPARATUS AND METHODS FOR THROUGH SUBSTRATE VIA TEST

(75) Inventors: Ebrahim H Hargan, Boise, ID (US); Layne Bunker, Boise, ID (US); Dragos Dimitriu, Boise, ID (US); Gregory King, Hastings, MN (US)

(73) Assignee: Micron Technology, Inc., Boise, ID (US)

( * ) Notice: Subject to any disclaimer, the term of this patent is extended or adjusted under 35 U.S.C. 154(b) by 405 days.

(21) Appl. No.: 13/179,247

(22) Filed: Jul. 8, 2011

(65) Prior Publication Data

US 2011/0267092 A1    Nov. 3, 2011

Related U.S. Application Data

(62) Division of application No. 12/173,722, filed on Jul. 15, 2008, now Pat. No. 7,977,962.

(51) Int. Cl.
*G01R 31/02* (2006.01)
*H01L 21/66* (2006.01)
*G11C 29/00* (2006.01)
*G11C 29/02* (2006.01)
*G01R 31/28* (2006.01)
*G11C 29/50* (2006.01)

(52) U.S. Cl.
CPC ........ *H01L 22/22* (2013.01); *G11C 2029/5006* (2013.01); *H01L 2924/014* (2013.01); *H01L 22/14* (2013.01); *G11C 29/816* (2013.01); *G11C 29/025* (2013.01); *G11C 29/02* (2013.01); *G01R 31/2853* (2013.01); *G11C 29/022* (2013.01)
USPC .......................... 324/762.01; 714/30; 714/724

(58) Field of Classification Search
USPC .................. 324/762.01–762.1, 51, 500, 510; 714/30, 724
See application file for complete search history.

(56) References Cited

U.S. PATENT DOCUMENTS

| 6,034,433 | A | 3/2000 | Beatty |
| 6,661,273 | B1 * | 12/2003 | Lai et al. ........................ 327/310 |
| 6,784,685 | B2 * | 8/2004 | Chao et al. ............... 324/754.05 |
| 6,787,802 | B2 * | 9/2004 | Yokogawa ....................... 257/48 |
| 6,898,062 | B2 * | 5/2005 | Russ et al. ....................... 361/56 |
| 7,603,598 | B2 * | 10/2009 | Hong et al. .................... 714/724 |
| 7,791,070 | B2 * | 9/2010 | Huang et al. ..................... 257/48 |
| 7,826,185 | B2 * | 11/2010 | Abou-Khalil et al. .......... 361/56 |
| 7,902,852 | B1 * | 3/2011 | Hess et al. ............... 324/762.09 |
| 7,977,962 | B2 * | 7/2011 | Hargan et al. ............ 324/762.01 |
| 8,130,481 | B2 * | 3/2012 | Yang et al. ....................... 361/56 |
| 2006/0044001 | A1 * | 3/2006 | Cano et al. .................... 324/765 |
| 2007/0145999 | A1 | 6/2007 | Cano et al. |
| 2008/0144243 | A1 | 6/2008 | Mariani et al. |
| 2009/0051039 | A1 | 2/2009 | Kuo et al. |
| 2010/0013512 | A1 | 1/2010 | Hargan et al. |
| 2012/0293196 | A1 * | 11/2012 | Hsu et al. ................. 324/762.01 |

* cited by examiner

*Primary Examiner* — Huy Q Phan
*Assistant Examiner* — Giovanni Astacio-Oquendo
(74) *Attorney, Agent, or Firm* — Schwegman Lundberg & Woessner, P.A.

(57) ABSTRACT

A stack of vertically-connected, horizontally-oriented integrated circuits (ICs) may have electrical connections from the front side of one IC to the back side of another IC. Electrical signals may be transferred from the back side of one IC to the front side of the same IC by means of through substrate vias (TSVs), which may include through silicon vias. Electronic apparatus, systems, and methods may operate to test and/or replace defective TSVs. Additional apparatus, systems and methods are disclosed.

9 Claims, 6 Drawing Sheets

APPARATUS AND METHODS FOR THROUGH SUBSTRATE VIA TEST

PRIORITY APPLICATION

This application is a divisional of U.S. application Ser. No. 12/173,722, filed Jul. 15, 2008 now U.S. Pat. No. 7,977,962, which is incorporated herein by reference in its entirety.

BACKGROUND

The semiconductor device industry has a market-driven need to continue to reduce the size of semiconductor devices to obtain higher performance and lower power consumption. To increase the amount of memory in a limited space, memory devices may be stacked in a vertical arrangement. Electrical connections through a memory device substrate may be provided by conductive vias, each at least partially through the substrate, from one surface of the memory chip substrate to the other surface. When silicon technology is used, these may be referred to as through silicon vias. The ability to save space by stacking and directly connecting memory chips with high reliability electrical connections becomes more difficult as dimensions are reduced.

DETAILED DESCRIPTION

Figure 1:
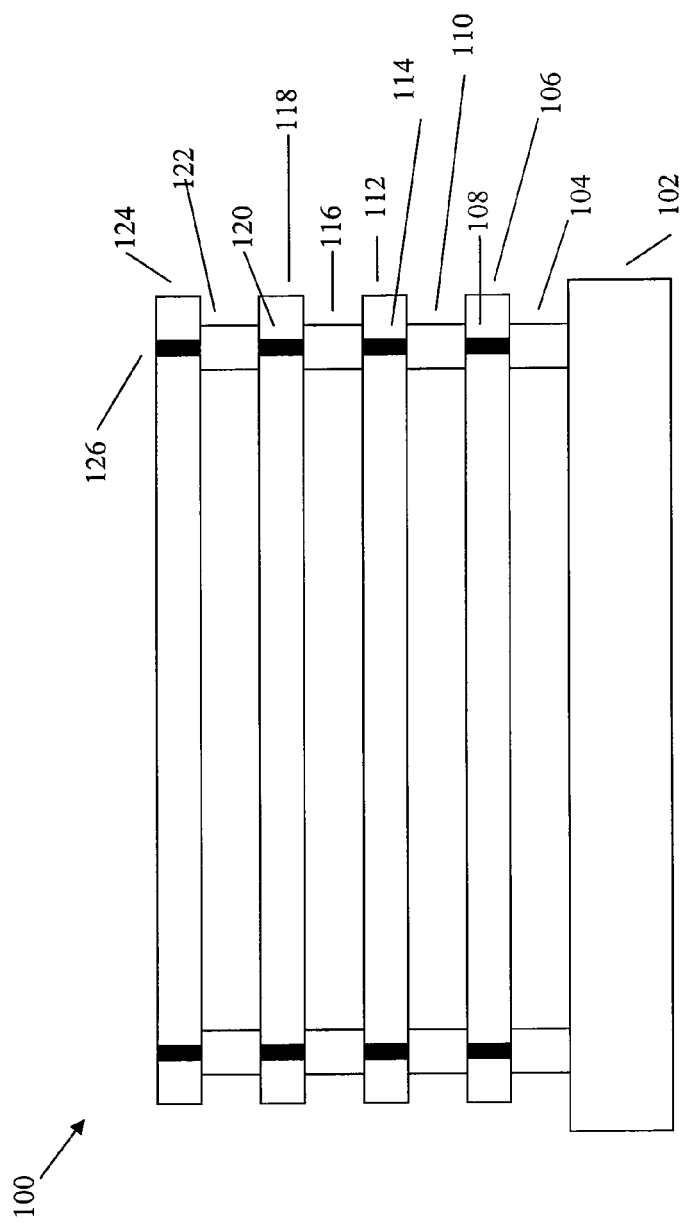
FIG. 1 illustrates a vertical stack of electronic devices, according to various embodiments.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be used and structural, logical, and electrical changes may be made. The various embodiments are not mutually exclusive, as some embodiments can be combined with one or more other embodiments to form new embodiments.

The term "substrate" as used in the following description may include any structure having an exposed surface with which to form an integrated circuit (IC) structure. The term "substrate" is understood to include semiconductor wafers and is also used to refer to semiconductor structures during processing and may include other layers that have been fabricated thereupon. A "wafer" and a "substrate" each include doped and undoped semiconductors, epitaxial semiconductor layers supported by a base semiconductor or insulator, as well as other semiconductor structures well known to one skilled in the art. The term "conductor" is understood to generally include n-type and p-type semiconductors and doped regions in semiconductors. The term "insulator" or "dielectric" is defined to include any material that is less electrically conductive than the materials referred to as conductors or as semiconductors. The term crystalline is understood to not be limited to large single crystals having a specified crystallographic orientation, but may include polycrystalline materials having a large number of moderately sized crystals having various crystallographic orientations. The term "amorphous" is not limited to a solid material having a completely disordered or glassy structure, but may include materials having some crystalline order over short distances—on the order of ten atomic separations or less.

The term "horizontal" is defined as a plane parallel to the conventional plane, i.e., the top surface of a substrate, regardless of the orientation of the substrate. The term "vertical" refers to a direction perpendicular to the horizontal. Prepositions, such as "front", "back", "on," "side" (as in "sidewall"), "higher," "lower," "over," and "under" are defined with respect to the conventional plane, i.e., the top surface of the substrate, regardless of the orientation of the substrate. The following detailed description is, therefore, not to be taken in a limiting sense.

Vertically stacked devices, such as vertically stacked ICs, having an electrical input or output (i.e., I/O) connection between the top of one IC to the bottom of another IC disposed directly above the first IC may benefit from shortened IC to IC signal path lengths. A typical IC may have active devices, such as transistors only on the top surface of the IC, and may use a through silicon via to transfer the electrical signal from a bottom contact to the top of the IC. An IC may include a substrate material that is different from silicon. A conductive via from a bottom to a top of a substrate, or at least partially through a substrate, may be termed a though substrate via (TSV). Thus, "TSV" is used herein to mean a through substrate via. A through silicon via, when silicon is used in a substrate, is an embodiment of a TSV. The electrical quality of the TSV used in a particular assembly may be determined by measuring the impedance, e.g., either or both of the resistance and the capacitance, of the stack including TSVs in each of the ICs.

FIG. 1 illustrates a vertical stack 100 of electronic devices, having a logic chip 102 serving as a base device. The described arrangement may also have a memory chip, a microprocessor, or any other type of IC chip as the base device without affecting the principles of the embodiment.

To reduce the amount of power consumed, and the access time involved when the logic chip 102 accesses memory (106, 112, 118, 124), the electrical path between the logic chip 102 and the memory should be as short as possible, and have a low resistance. One method of obtaining short electrical paths includes the use of conductive bumps 104, typically formed of gold, copper, or solder, on I/O pads of the chip 102. These bumps 104 may be directly connected to backside contacts on the memory chip 106. It should be noted that the chip 106 may also be another logic chip or any other IC chip without loss of generality with respect to the described embodiment.

To convey electrical signals from chip 102 and the bump 104 to the circuitry on the top surface of the memory chip 106 with the shortest path length, it may be convenient to use a TSV 108. Additional memory chips may be vertically arranged above the memory chip 106 to address the same I/O connections included in the memory chip 106. To accomplish this, the TSV 108 may connect to both the circuitry of memory chip 106 and to a conductive bump 110, providing access to a second memory chip 112. TSV 114 connects to the circuitry of chip 112, and to a conductive bump 116 providing signal access to memory chip 118. Chip 118 is shown with a TSV 120 that connects to the circuitry of memory chip 106 and to conductive bumps 122.

Bumps 122 connect to the bottom surface of memory chip 124 and TSV 126 connects the chip 118 to the circuitry of the chip 124. Four memory chips 106, 112, 118, and 124 are shown in the figure, but there is no general limit as to how many IC chips of any type may be used in the arrangement shown to provide short electrical paths between various stacked chips.

Figure 2:
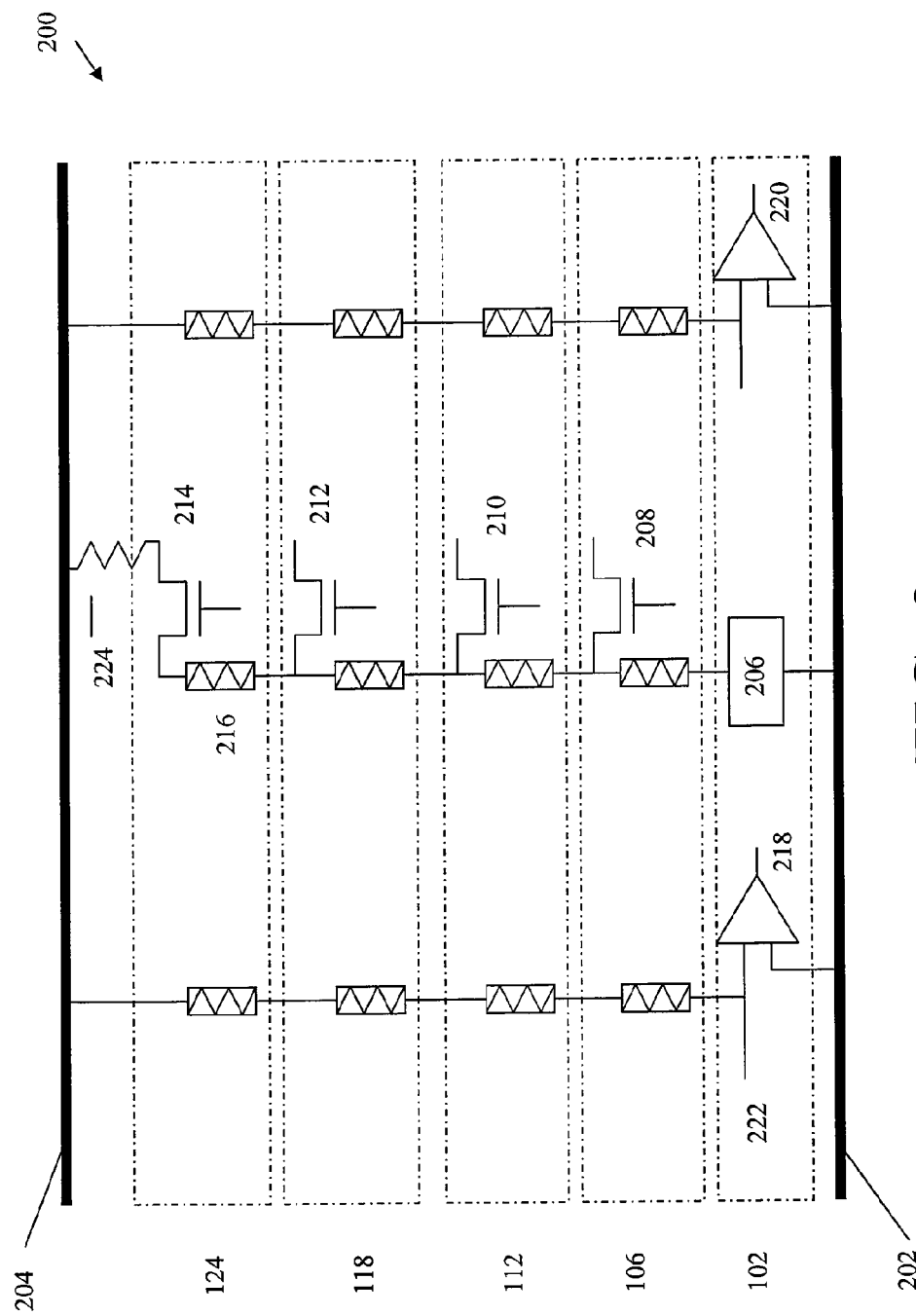
FIG. 2 is an electrical schematic of a device having the stack arrangement of FIG. 1, according to various embodiments.

FIG. 2 is an electrical schematic of a device 200 having the stack arrangement of FIG. 1, according to various embodiments. The dotted boxes 102, 106, 112, 118, and 124 indicate that the circuitry contained within the dotted box is from the same numbered feature of FIG. 1, with the illustrative logic chip 102 being shown as the base device of the vertical stack and memory chips 106, 112, 118, and 124 sequentially located above the logic chip 102. It is not necessary that a logic chip be the base device, and any order, or different types of ICs may be used in the arrangement shown.

Due to randomly distributed manufacturing defects, certain TSVs (e.g., TSV 216) may be totally open or short-circuited, or may have unacceptably high resistance and/or capacitance, and thus may add to chip communication time (e.g., by way of an added RC delay). For example, a TSV having higher than normal resistance may add 100 picoseconds signal delay. Therefore, measurement of the TSV quality in assembled chip stacks may be beneficial if the complexity of added circuitry to perform the measurement and its associated semiconductor area penalty are low.

In an embodiment, the TSV quality of stack 100 may be determined. One input of a sense amp 218 may be connected to a reference voltage (Vref) 202, and a second sense amp input may be connected to a current source 222 and to the TSV stack, which may comprise one or more series connected TSVs. The voltage (V1) at the second input of sense amp 218 is a measure of the total TSV stack resistance (Rx). In an embodiment, the memory chips 106, 112, and 118 are not powered up during the measurement of TSV quality. In an embodiment, the memory chip 124 has a selected termination resistance (Rterm) 224 to a selected termination voltage (Vterm) 204. The Rterm value may be selected to be small compared to the typical resistance of the TSV stack, for example Rterm may be approximately 50 ohms, while Vterm may be approximately 0.6 volts to improve sensitivity.

In an embodiment, the current source 222 of logic chip 102 may include additional power drivers to provide a range of test currents, for example 0.25 to 2.5 milliamps, which may comprise direct current. In an embodiment, the individual memory chips 106, 112, 118, and 124 may have individual switches connecting or disconnecting an individual TSV to the chip circuitry for a TSV test. Various combinations of chips may be turned on or off during different parts of a test. The individual switches may be realized in various formats, for example by use of transistors 208, 210, 212, and 214. In an embodiment, the current source 222 and the sense amp 218 are located as extra circuitry in the base device, such as the logic chip 102, where the base device may be a chip having other functions, for example a memory chip or a microprocessor.

The resistance of a TSV stack may be determined by sweeping a range of current values at the output of current source 222, and determining trip points for a high and a low Rx value at sense amp 218 for the connected TSV stack. By driving stepped currents from 0.25 to 2.5 milliamps in 0.25 milliamp steps, the voltage measured at 218 may differ by more than 0.10 volts over a TSV stack resistance range of 5 ohms to 50 ohms, thus the value of the voltage at 218 provides a measurement of TSV quality.

Reference voltage 202 and supply voltage 204 may connect to a series of sense amps such as 218 and 220. Reference voltage 202 may be provided by one or more power supplies, or any stabilized voltage supply between the power supplies, and supply voltage 204 may be provided by a ground connection. There may be sense amps attached to each vertical stack of TSVs that are to be tested, which may be more than the two shown, including any number up to the total number of I/O pads on the memory chips or other type of IC chips to be tested. The reference voltage (Vref) may be varied to step through a series of TSV tests to determine the quality of partially open TSVs by measuring the voltage (V1) at the second input of sense amp 218 as a measure of the total TSV stack resistance (Rx).

In an embodiment, the sense amp 218 may have additional control inputs to form a control circuit 206. The TSVs may be tested by comparing a measured RC delay in a ring oscillator signal to a signal from a programmable delay line. The amount of delay may be incremented until a particular number of good TSV stacks are found. If a defective (e.g., poorly performing stacks having a resistance greater than a selected value) TSV stack is found, in an embodiment, the circuit may comprise a selected number of redundant TSV stacks and circuitry to replace a defective TSV stack with up to a selected number of tested good redundant TSV stacks.

In an embodiment, the control circuit 206 provides a reference clock edge to a selected one of the memory chips, for example 124, which is selected by activation of transistor 214 initiating the drivers on the memory 124. The output of the TSV stack at the sense amp in control circuit 206 is latched for each increment in the delay line value and analyzed to determine the TSV quality, such as RC delay time, and to compare the TSV to other TSV stacks on the selected memory device. If a TSV is close to a selected resistance limit, it may be replaced by one of the redundant TSV stacks. This may continue until the best TSV stacks are found.

In various embodiments, the test may be done on operational devices as they age to evaluate device degradation and potential failure rates. Various embodiments use the resistance of the TSV stack and the RC delay to determine a quality value, enable selection of the TSV stacks in a group of main and redundant stacks considered to be the best in the group, and to permit repair and replacement of defective TSV stacks.

Figure 3:
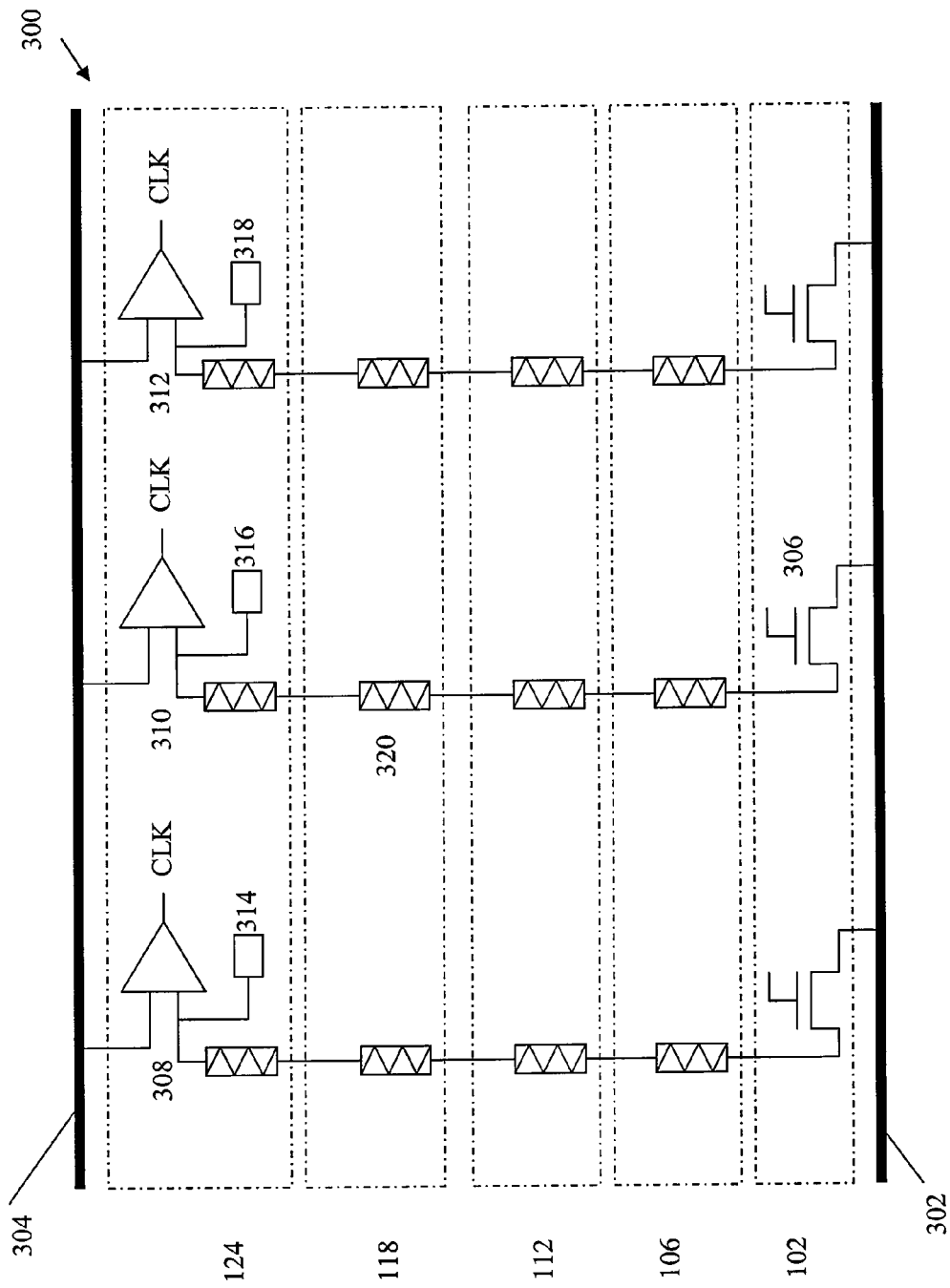
FIG. 3 is an electrical schematic of a device having the stack arrangement of FIG. 1, according to various embodiments.

FIG. 3 is an electrical schematic of a device 300 having the stacked arrangement of FIG. 1, according to various embodiments. Device 300 includes components that determine a TSV stack's quality by measuring the resistance of the TSV stack and testing the TSV stacks to select the best ones of the total main TSVs and redundant TSVs. A direct current method may be used for measurement and testing that does not include a high-speed clock. The sense amps used in the method may be the existing sense amps on the memory chips 106, 112, 118 and 124 used in normal operation and function of these chips and thus may use less additional circuit space as compared to various embodiments that use sense amps on the base chip as discussed with respect to FIG. 2. As in the previous figure, the dotted boxes are numbered as in FIG. 1 to show in which chip (i.e., 102, 106, 112, 118, or 124) the disclosed circuitry is contained.

In the previously discussed method, the RC delay measurement was made dynamically and used a termination resistance and voltage in conjunction with ring oscillator edge delays. Device 300 includes a voltage supply 302, such as Vcc, connected via an enable transistor 306 to the selected TSV stack, such as the stack of TSVs including TSV 320. The top memory 124 in the stack includes connections from the three TSV stacks shown in the figure to respective ones of sense amps 308, 310, or 312. It should be noted that the present embodiment is not limited to four memory chips located on a logic chip as shown; any number or type of IC chip may be used. The sense amps may be selected from among those normally used in the operation of a memory device if the top chip is a memory or contains embedded memory elements and thus not add substantial additional circuit area. In various embodiments, memory chips 106, 112, and 118 may have similar sense amp circuitry to that shown for the TSVs in chip 124.

The connection between the TSV stack to be tested and the sense amp may include circuitry 314, 316, or 318, comprising a current source and a ground reference. The current source may provide approximately 200 micro amps. The other input to the sense amps 308, 310, and 312 may be driven by a voltage reference (Vref) 304, which may be set by a control circuit (not shown for simplicity). The voltage reference 304 may be sequentially stepped up or down in value in comparing adjacent TSV stacks.

The output of the sense amps 308, 310, and 312 may go to a latch controlled by the clock for testing. The enable transistors 306 may be constructed to have essentially the same "on" resistance to the voltage supply 302 and to have a low capacitance and "off" state leakage. Device 300 may test TSVs by comparing the measured resistance values as the Vref value is stepped through a selected range by a control circuit. The relative resistance of the TSV stacks may be compared to select the best TSV stacks without a determination as to whether or not any particular TSV is in a specified range. It should be noted that while only three parallel TSV stacks are shown in the described embodiment, there is no general limit to the number of TSV stacks that may be compared. The TSV stack test includes adjusting a reference voltage connected to a sense amplifier to provide a plurality of voltage steps of a selected value, and then determining when the reference voltage equals a voltage on the other input of the sense amplifier. The sense amplifier may be connected to an electrical path formed of a series of connected vias and driven by a current supply. The reference voltage values for each of the electrical paths are compared and the quality of each electrical path can be tested in this manner. This may also be done as part of a reliability test, an infancy failure test or as a lifetime test.

Figure 4:
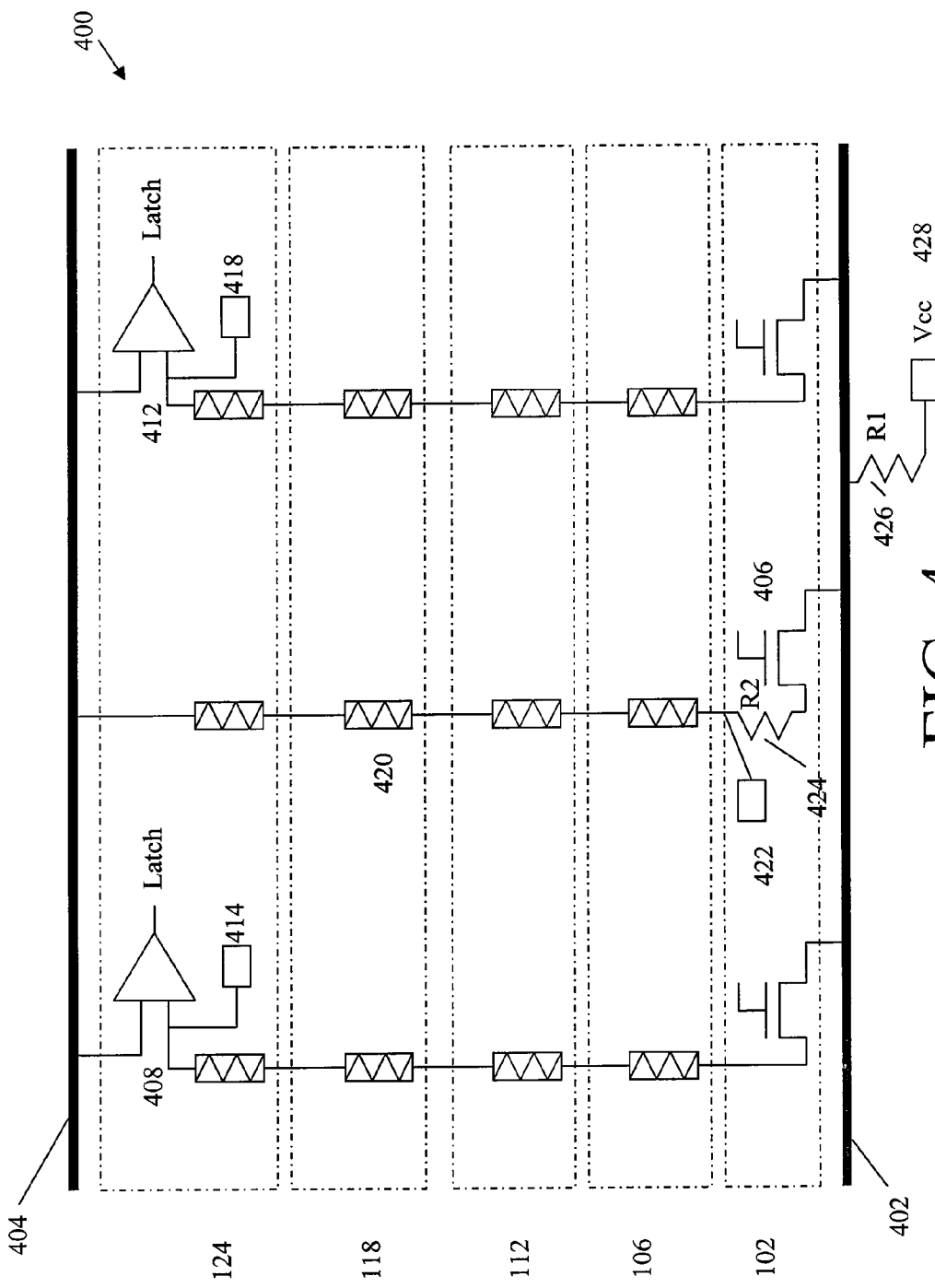
FIG. 4 is an electrical schematic of a device having the stack arrangement of FIG. 1, according to various embodiments.

FIG. 4 is an electrical schematic of a device 400 having the stack arrangement of FIG. 1, according to various embodiments. A device 400 includes a lower voltage supply 402 positioned between the voltage supply 428 and an upper voltage reference Vref 404. Lower voltage supply 402 is separated from voltage supply 428 by a first resistance R1 426. Voltage supply 402 is separated from the upper reference supply 404 by the on resistance Rsw of an enable transistor 406, a second resistance R2 424, and the value of the total resistance of TSV 420. Since TSV stack 420 is used to bias upper reference voltage 404, it is useful to verify that TSV 420 is a known good stack in this embodiment. The arrangement shown in device 400 may allow testing of the three shown TSV stacks using direct current and without need for a clock, and may determine an absolute resistance measurement of the total resistance of each of the TSV stacks. Because the upper reference is biased by the current flowing through TSV stack 420, this method benefits from TSVs that provide low voltage drop. It is not necessary that the TSV resistance be low, since the amount of current passing through the TSV stack is low, or may be considered to be essentially zero. However, the TSV stack should conduct a measurable amount of electrical current—on the order of 100 microamps given a supply voltage Vref of 3.3 volts.

Each TSV stack to be measured has a sense amp (408 and 412), which may be selected from the sense amps used in normal operation in a memory chip such as 124, or there may be a sense amp formed for this purpose on each chip of the stack 102, 106, 112, 118, 124, or any combination of these. Each sense amp 408 and 412 may have a current source with ground connection 414 and 418 respectively. A current source 422 may be connected to both the resistance R2 and the TSV stack 420 to provide a reference current Iref. The value of Iref is chosen based upon the values of TSVs to be measured (for example 420), R2, and the sensitivities of the sense amps 408 and 412, and may be about 1 milliamp. The sense amps 408 and 412 may be used to determine if their corresponding TSV resistance is greater or less than R2 by comparing the upper (Vref) and lower (Vtsv) sense amp inputs, and the value may be latched for use in repair and redundancy decisions.

The upper reference Vref 404 in this embodiment may have a value determined by the formula Vref=Vcc−Iref (R1+R2+Rsw). The voltage of the TSV stack Vtsv is determined by the formula Vtsv=Vcc−Iref (R1+Rtsv+Rsw). Vtsv may comprise the voltage value at the TSV input of the sense amps 408 and 412, while Vref may comprise the voltage value at the other input of the sense amp. The high gain sense amp 408 then amplifies the difference between Vref and Vtsv and provides a reliable comparison measurement.

The resistance of the TSV stack Rtsv may be determined from the combination of the above formula for Vref and Vtsv by use of the formula Vtsv Vref=Iref (R2−Rtsv). Thus the difference output of the sense amp 408, plus the known value for the reference resistance 424 R2, and the value for the current source 422 Iref, provide a method of calculating the TSV stack resistance Rtsv. The value of the reference current supply 422 Iref may be varied to provide further testing capability, such as determining lifetime degradation and sensitivity.

Figure 5:
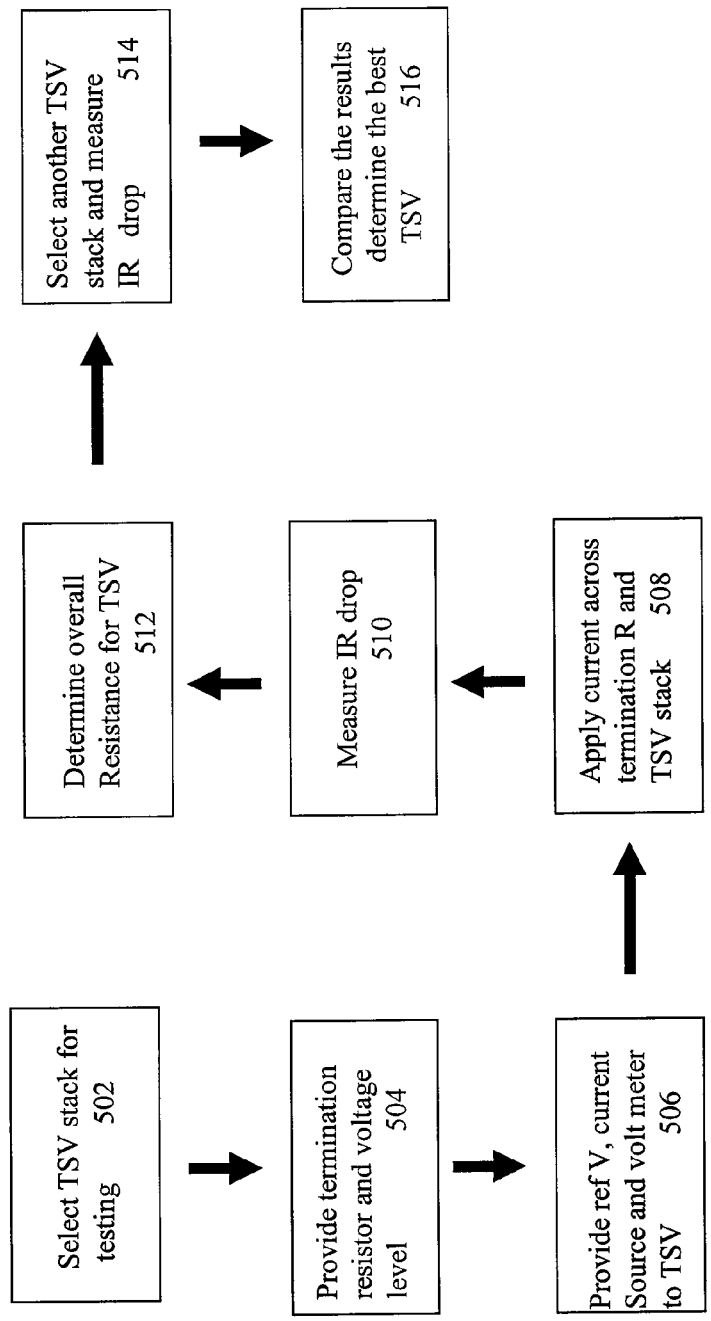
FIG. 5 illustrates a method of testing TSVs, according to various embodiments.

FIG. 5 illustrates a method of testing TSVs, in accordance with various embodiments. The method of testing TSVs includes selecting TSV stacks for testing at step 502 and providing a termination resistor and a termination voltage level at step 504. Connecting a reference voltage source, a current source and a voltage measuring device to the TSV at step 506 enables the application of a current across both of the TSV stack to be tested and the termination resistance at step 508, which results in an IR voltage drop. Measuring the voltage drop at step 510 provides a relative estimation of the resistance of the TSV stack at step 512. Repeating the test method for another TSV stack at step 514 permits the TSV stacks to be compared at step 516, which enables the selection of the best TSV stacks for use in a functional device.

Figure 6:
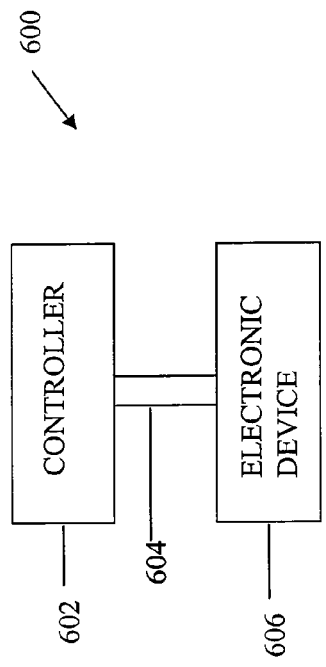
FIG. 6 illustrates a simplified block diagram of a system including a controller coupled to an electronic device formed in accordance with various embodiments.

FIG. 6 illustrates a simplified block diagram of a system 500 including a controller coupled to an electronic device formed in accordance with various embodiments. The system 600 includes one or more devices, including at least one device having stacked TSVs tested, selected, or repaired according to various disclosed embodiments. The electronic system 600 may include a controller 602, a bus 604, and an electronic device 606, where bus 604 provides electrical conductivity between controller 602 and electronic device 606. In various embodiments, the controller 602 and/or electronic device 606 may include a device having stacked TSVs tested, selected, or repaired as previously discussed herein. Electronic system 600 may include information handling devices, wireless devices, telecommunications devices, fiber optics devices, automotive devices, electro-optic devices, mobile electronics, handheld devices, and computer systems. Electronic device 606 may comprise a microprocessor, a floating point unit, an arithmetic logic unit, a memory device, a multiplexer, an address decoder, a power controller, or any other electronic device used in computers, telecommunications, sensors, displays, and other products.

Figure 7:
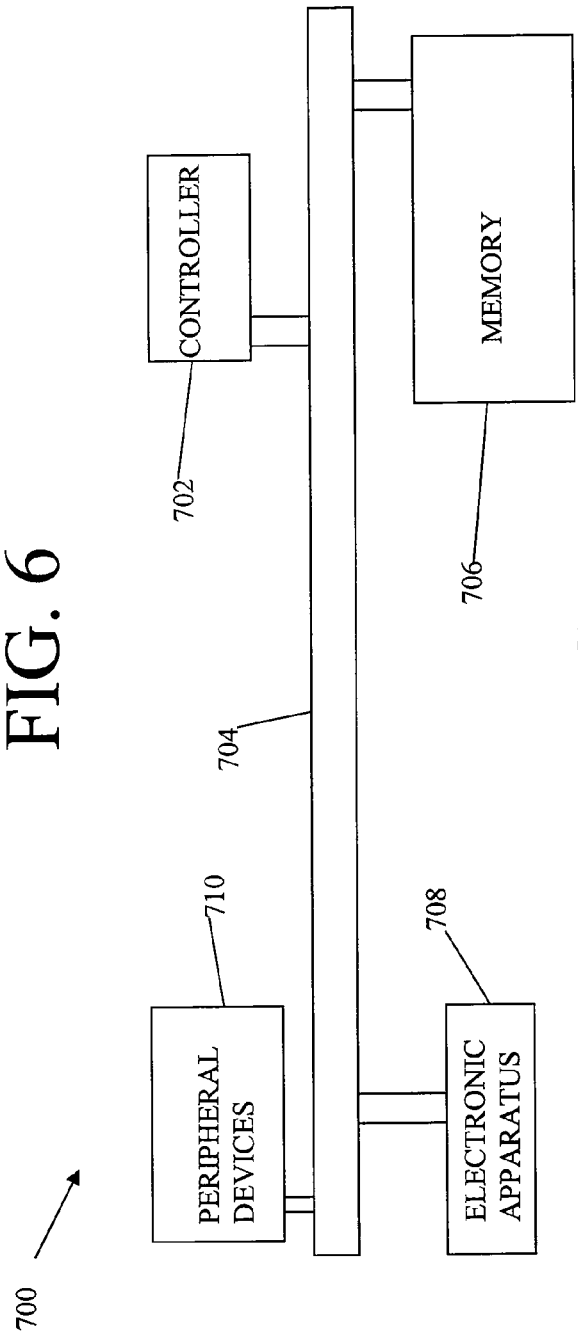
FIG. 7 illustrates an electronic system having devices formed in accordance with various embodiments.

FIG. 7 depicts a diagram of an electronic system 700 having at least one device formed in accordance to the various embodiments, including a controller 702 and a memory 706. Controller 702 and/or memory 706 may include at least one device having stacked TSVs tested, selected, or repaired as discussed herein.

The system 700 may also include an electronic apparatus 708 and a bus 704, where the bus 704 may provide electrical conductivity and data transmission between controller 702 and electronic apparatus 708, and between controller 702 and memory 706. The bus 704 may include an address, a data bus, and a control bus, each independently configured. The bus 704 may use common conductive lines for providing address, data, and/or control, the use of which may be regulated by the controller 702.

In some embodiments, the electronic apparatus 708 may include additional memory devices configured similar to the memory 706 with devices having stacked TSVs tested, selected or repaired, as disclosed herein. Some embodiments may include an additional peripheral device 710 coupled to the bus 704. In an embodiment, the controller 702 comprises a processor. Any of the controller 702, the memory 706, the bus 704, the electronic apparatus 708, and peripheral devices 710 may include at least one device having stacked TSVs tested, selected, or repaired in accordance with the disclosed embodiments.

System 700 may include, but is not limited to, information handling devices, telecommunication systems, mobile electronic devices such as laptop computers, handheld personal electronic devices such as personal digital assistants (PDAs) and palm tops, handheld communication devices such as cell phones, digital cameras and DVD recorders, and computers. Peripheral devices 710 may include displays, additional storage memory, or other control devices that may operate in conjunction with controller 702 and/or memory 706.

Various embodiments may include the activities of determining an electrical quality value for a stack of vertically connected horizontally oriented ICs having electrical connections from the front side of one IC to the back side of another IC. The electrical signals may be transferred from the back side of one IC to the front side of the same IC by means of a TSV. The testing, selection of good TSVs, and replacement of defective TSVs with redundant TSVs may be accomplished in various ways similar to the three embodiments disclosed herein. Various embodiments measure the absolute value of resistance through the TSV using two additional resistors and sense amps from a memory device, which is affected by defects in TSVs used to provide bias transfer to the sense amp inputs. Various embodiment compare relative resistance of TSVs in parallel using stepped voltage reference values, a clock, and a clocked latching scheme, which is relatively unaffected by variability in TSV resistance values. Such embodiments may be implemented using minimal additional circuitry in the chips in which the TSVs are disposed. RC delay value for TSVs may be determined by comparing the delay of a ring oscillator signal to a variable delay line, using a ring oscillator, a variable delay line, a high speed clock, sense amplifiers, and a controller circuit added to a base logic chip. Thus, many embodiments may be realized.

For example, in various embodiments, a method of testing a stack of connected electronic devices may include providing series connected electrical paths between selected I/O pad connections on each one of a plurality of electronic devices, and providing termination resistances and termination voltages for the series connected electrical paths. Using a reference voltage, a current source, and a voltage measuring device allows test mode circuitry in each electronic device to determine an overall resistance value for each series connected electrical path by comparing an IR drop caused by an imposition of current from the current source across the termination resistor and a sum of resistances formed by the series connected electrical path. In various embodiments, the type of devices in the stack may include logic chips, state machines, microprocessors, and memory chips. In various embodiments, the voltage measuring device may be an added portion of a logic chip, which may form a base for mounting the remaining chips. In various embodiments, the termination resistor and termination voltage may be provided in a memory device in the stack of connected electronic devices, and the overall resistance value may be determined by setting the current source to sweep a selected range of about 250 microamps to 2.5 milliamps and then determining a high trip point value and a low trip point value in a plot of the readout of the voltage measuring device. The current source may provide a DC current generated in one of the plurality of electronic devices, and the high and low trip point may have as little as about a 50 millivolt difference or as much as about a 500 millivolt difference, and may have a difference of approximately 10% between the high and the low trip points. The I/O pad connection on each one of the electronic devices may comprise a bi-directional I/O pad on a logic device or a memory device. In various embodiments, a stacked arrangement of ICs may include a ring oscillator circuit forming part of one of the circuits that provides a signal to the series connected electrical path, and a variable delay line that compares the rate of an additional RC delay between the series connected electrical paths to determine relative quality factors for each series connected electrical paths.

In various embodiments a method may include comparing electrical resistances of electrical paths comprising a series connected plurality of TSVs by adjusting a reference voltage connected to a first input terminal of a sense amplifier circuit through a plurality of voltage steps. This activity may be managed by an included controller circuit. The method may include connecting a second input terminal of the sense amplifier circuit to at least one of the electrical paths, connecting a first current supply to one of the electrical paths, determining when the reference voltage equals the voltage on the second input terminal of the sense amplifier, and recording the reference voltage value for each electrical path. In this fashion, a ranked quality factor for each of the electrical paths may be obtained. In various embodiments, a second current supply may be connected to the second input terminal of the sense amplifier, which may be set to about 0.20 milliamps. In an embodiment, the sense amplifier may comprise an operational element of a memory circuit such as a memory circuit or chip, which is included in the plurality of circuits forming the series connected plurality of TSVs.

In various embodiments, a method of measuring a resistance value in each one of a plurality of electrical signals may include connecting a plurality of integrated circuits to form a plurality of series connected electrical TSV stacks, connecting a first reference supply to a power supply through a first resistor, connecting one end of a test series connected electrical TSV string to the first reference supply through a second resistor, forming a voltage divider. In an embodiment, a test enable transistor may be used to turn the testing device on and off. The testing device may be used as part of the end of fabrication function testing, and it may be used as a lifetime degradation test.

The resistance of each series connected TSV stack may be determined by measuring the output of a connected sense amplifier. Connect a first end of each TSV stack through an enable transistor to the first reference power supply, and connect the other end of the TSV stack to a second reference line. Connect each TSV stack to a first input of a sense amplifier, and connect the second input of the sense amplifier to the second reference line. In an embodiment, the second reference line is not directly connected to a power supply and is only biased by the test via string. The sense amplifier may be part of a memory circuit in an integrated circuit, and each one of the enable transistors may be structured to have the same size, width, and electrical properties to provide improved accuracy.

In various embodiments a method of testing a stack of interconnected electronic devices includes comparing the voltage drop caused by a current source across a termination resistor and the sum of a resistance formed by a series connected electrical path between input/output connections on one electronic devices and another to determine the quality of the series connected electrical path.

In various embodiments, a circuit for measuring a resistance value in TSV stacks may include a floating potential reference, and a plurality of operational amplifiers, for example the sense amplifiers found in memory devices. Each operational amplifier may be connected between the floating potential reference and a top portion of one of the TSV stacks. Enable switches may be connected between a bottom portion of the TSV stacks and a second potential reference. A combination of a first resistor and a second resistor may allow the TSV stacks to be measured and compared. The first resistor may be connected between the second potential reference and a power supply. The second resistor may be connected between both the second potential reference and a bottom portion of a TSV stack, and between a top portion of the test series connected electrical TSVs and the floating potential reference line. In an embodiment, the test TSVs may be made as identical to each one of the plurality of TSVs to be measured as possible, which may be accomplished by forming the test and vias on the same ICs at the same time of manufacture. A current source may be connected to the top portion of one of the plurality of series connected electrical TSVs and one of the plurality of operational amplifiers to provide improved sensitivity.

In various embodiments, a circuit for measuring a resistance value in TSV stacks may include a first voltage reference source, and a plurality of operational amplifiers, for example the sense amplifiers found in memory devices. The plurality of operational amplifiers may be connected to the first voltage reference source and connected to an end of one of a plurality of series connected electrical through substrate vias. The second end of the series connected electrical through substrate vias may be connected to a second voltage reference source. The first voltage reference source may be a variable voltage to adjust the sensitivity of the resistance test, and may be varied during testing by the use of a control circuit. The circuit may further include current sources connected to both the operation amplifiers and the series connected electrical through substrate vias to increase the ability to measure small resistance values. The circuit may include enable transistors connected between the series connected electrical through substrate vias and the second voltage reference source to turn the individual vias on and off for testing.

In various embodiments an apparatus may include a first potential reference having a connected operational amplifier. The operational amplifier may be a sense amplifier such as found in memory devices and logic device circuits. The operational amplifier may also be connected to a current source, and an end of series connected electrical through substrate vias. There may also be a state machine, for example a micro processor, a ring oscillator, or a variable delay line, connected to the first potential reference and an end of a series connected group of test through substrate vias. Each of the test through substrate vias may be connected to an enable transistor and the enable transistor may be connected to a selected portion of circuitry having a selected resistance and capacitance. The selected circuitry may be the entirety of a integrated circuit containing the through substrate via, and serve as part of an RC delay test. A second potential reference may be connected to a second end of the series connected electrical through substrate vias as well as to a termination resistor connected to an end of the series connected group of test through substrate vias. The apparatus may further include a variable first voltage reference source enabled to vary during testing or during operation. The variation may be performed by a control circuit to vary the first voltage reference source in a preselected pattern or in response to test conditions and results.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a few embodiments for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A method of testing a stack of interconnected electronic devices, comprising:
comparing a voltage drop caused by imposition of a repeating signal from a ring oscillator circuit and a current from a current source across a termination resistor and a sum of a resistance formed by a series connected electrical path between an input/output connection on one of a plurality of electronic devices included in the stack and an input/output connection on another one of the plurality of electronic devices included in the stack to determine a quality of the series connected electrical path in the stack, wherein the ring oscillator circuit forms a part of one of the plurality of electronic devices.

2. The method of claim 1, wherein the comparing is repeated after the plurality of electronic devices is exposed to at least one of a function test, a static bias test, an environmental stress, or an accelerated aging test for a selected period of time.

3. The method of claim 2, wherein the comparing is repeated to determine at least one of an aging rate or a failure rate.

4. The method of claim 3, wherein at least one of a value of the termination resistor and a termination voltage are varied prior to the comparing.

5. The method of claim 1, further comprising:
comparing a voltage drop in a first one of the plurality of electronic devices while the remaining ones of the plurality of electronic devices are in an un-powered state.

6. A method for testing a stack of a plurality of interconnected electronic devices, comprising:
comparing a voltage drop, caused by imposition of a repeating signal from a ring oscillator circuit that forms a part of one of the plurality of electronic devices, across a first termination resistor and a sum of a resistance formed by a first series connected electrical path between an input/output connection on one of the plurality of electronic devices and a second termination resistor and a second series connected electrical path between an input/output connection on another one of the plurality of electronic devices to determine a quality of each of the first and second series connected electrical paths.

7. The method of claim 6 further comprising comparing a measured (RC) delay between the first and second series connected electrical paths to determine the quality of each of the first and second series connected electrical paths.

8. The method of claim 7 further comprising replacing one of the first or the second series connected electrical paths with a redundant series connected electrical path in response to the quality.

9. The method of claim 6 wherein the signal from the oscillator is a repeating clock signal.

* * * * *